United States Patent
Xu et al.

(10) Patent No.: US 12,261,238 B2
(45) Date of Patent: Mar. 25, 2025

(54) CONTROLLING DEVICE HAVING AN ENERGY HARVESTING FEATURE

(71) Applicant: Universal Electronics Inc., Scottsdale, AZ (US)

(72) Inventors: Rex Xu, Foothill Ranch, CA (US); Ara Gharapetian, Porter Ranch, CA (US)

(73) Assignee: Universal Electronics Inc., Scottsdale, AZ (US)

( * ) Notice: Subject to any disclaimer, the term of this patent is extended or adjusted under 35 U.S.C. 154(b) by 0 days.

(21) Appl. No.: 18/376,922

(22) Filed: Oct. 5, 2023

(65) Prior Publication Data

US 2024/0038917 A1 Feb. 1, 2024

Related U.S. Application Data

(63) Continuation of application No. 17/742,483, filed on May 12, 2022, now Pat. No. 11,830,957.

(51) Int. Cl.
*H01L 31/054* (2014.01)
*H02J 7/35* (2006.01)

(52) U.S. Cl.
CPC ............ *H01L 31/0543* (2014.12); *H02J 7/35* (2013.01)

(58) Field of Classification Search
CPC ....... H01L 31/02008; H01L 31/022425; H01L 31/0216; H01L 31/02168; H01L 31/042; H01L 31/048; H01L 31/049; H01L 31/054; H01L 31/0543; H01L 31/0547; H02J 7/35
See application file for complete search history.

(56) References Cited

U.S. PATENT DOCUMENTS

| | | | |
|---|---|---|---|
| 7,605,689 B2 | 10/2009 | Hein et al. | |
| 8,193,759 B2 * | 6/2012 | Lee | G08C 17/02 320/101 |
| 9,297,557 B2 | 3/2016 | Dyson et al. | |
| 11,523,488 B1 * | 12/2022 | Recker | H05B 47/105 |
| 2008/0252432 A1 | 10/2008 | Hein | |
| 2011/0148341 A1 | 6/2011 | Lee | |
| 2012/0017988 A1 * | 1/2012 | Moslehi | H01L 31/00 136/252 |
| 2023/0369524 A1 | 11/2023 | Xu | |
| 2024/0097063 A1 | 3/2024 | Xu | |
| 2024/0194419 A1 | 6/2024 | Wright | |

FOREIGN PATENT DOCUMENTS

| | | |
|---|---|---|
| CN | 201207626 Y * | 3/2009 |
| DE | 202020104180 U1 | 9/2020 |
| JP | 5519285 B2 | 6/2014 |

OTHER PUBLICATIONS

Machine translation of CN-201207626-Y, Yang, Z. (Year: 2009).*
Machine translation of DE-202020104180-U1, Saint-Gobain Sekurit. (Year: 2020).
International Search Report and Written Opinion of application number PCT/US2024/057754, 8 pp.

* cited by examiner

Primary Examiner — Mayla Gonzalez Ramos
(74) Attorney, Agent, or Firm — Greenberg Traurig, LLP

(57) ABSTRACT

A controlling device has at least a light-based energy harvesting system disposed within the controlling device housing. The light-based energy harvesting system is operative to supply power to at least one of a processing device and a transmitter of the controlling device. The light-based energy harvesting system includes s a substrate having a photovoltaic (PV) active area and a lens, separate from the substrate, disposed over the PV active area.

6 Claims, 4 Drawing Sheets

CONTROLLING DEVICE HAVING AN ENERGY HARVESTING FEATURE

RELATED APPLICATION INFORMATION

This application claims the benefit of U.S. application Ser. No. 17/742,483, filed on May 12, 2022, which application is incorporated herein by reference in its entirety.

BACKGROUND

The following relates generally to controlling devices and, more particularly, to a controlling device, such as a hand-held, remote control device, having one or more energy harvesting features.

A remote control with an energy harvesting feature is generally known in the art. For example, U.S. Pat. No. 7,605,689 describes a remote control that includes energy harvesting in addition to a battery. The energy harvesting and the battery may be switchably used to power transmit operations, receive operations, and/or display operations. The remote control may be used as part of an automotive vehicle remote keyless entry system in which vehicle status is displayed by the remote control Similarly, U.S. Pat. No. 8,193,759 describes a remote body that includes a light-powered battery and a control panel. The control panel has a plurality of buttons. The light-powered battery module is disposed in the remote and comprises the light panel, the control unit, and the storage unit. The light panel is a rigid or flexible light panel and is used for receiving light energy. The wireless control module disposed in the remote comprises the transmitting unit, the sensing unit, and the activating unit. The light-powered battery module converts and stores the light energy and provides power to the wireless control module, thereby providing energy savings and environmental conservation benefits.

So as to avoid having to repeat the well-known information that is contained within these patents, U.S. Pat. Nos. 7,605,689 and 8,193,759 are incorporated herein by reference in their entirety so as to be a part of the subject specification.

SUMMARY

The follow generally describes a controlling device that includes one or more energy harvesting features. More particularly, the following describes a controlling device that includes at least a light-based energy harvesting feature. Furthermore, the follow describes that, when the controlling device includes the light-based energy harvesting feature, the controlling device is designed to maximize the efficiency of the light-based energy harvesting feature while blending that energy harvesting feature into the overall design of the device.

A better appreciation of the objects, advantages, features, properties, and relationships of the described controlling devices will be obtained from the following detailed description and accompanying drawings which set forth illustrative embodiments which are indicative of the various ways in which the principles described hereinafter may be employed.

BRIEF DESCRIPTION OF THE DRAWINGS

For use in better understanding the example controlling devices described hereinafter reference may be had to the following drawings in which.

DETAILED DESCRIPTION

Figure 1:
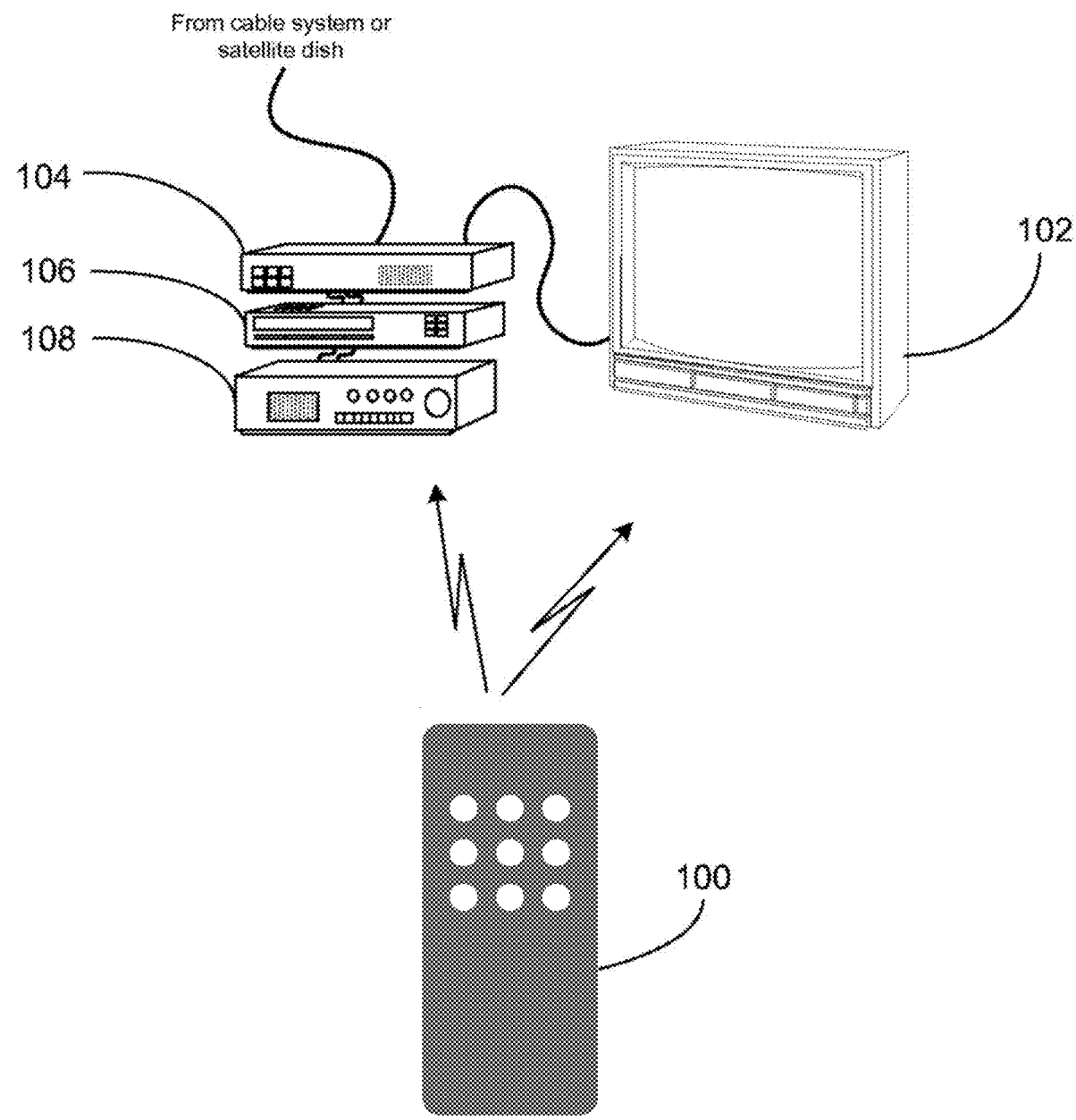
FIG. 1 illustrates an example system in which the example controlling devices may be utilized.

By way of example, FIG. 1 shows an exemplary system, including controllable appliances, such as a set top box ("STB") 104, a VCR 106, an audio amplifier/receiver 108 and a television 102, as well as a controlling device 100. The controlling device 100 includes one or more energy harvesting features as described below and is capable of transmitting commands to the appliances, using any convenient IR, RF, Point-to-Point, or networked protocol, to cause the appliances to perform operational functions, such as to turn on/off, to tune to a media content, to change volume levels, etc. While illustrated in the context of a STB 104 with a VCR 106, audio system 108, and television 102, it is to be understood that controllable appliances can include, but are not limited to, televisions, VCRs, DVRs, DVD players, cable or satellite converter set-top boxes (STBs), amplifiers, CD players, game consoles, home lighting, drapery controls, fans, HVAC systems, thermostats, personal computers, etc. As such, the instant example disclosures are not intended to be limiting as to type or quantity of controllable appliances or equipment.

Figure 2:
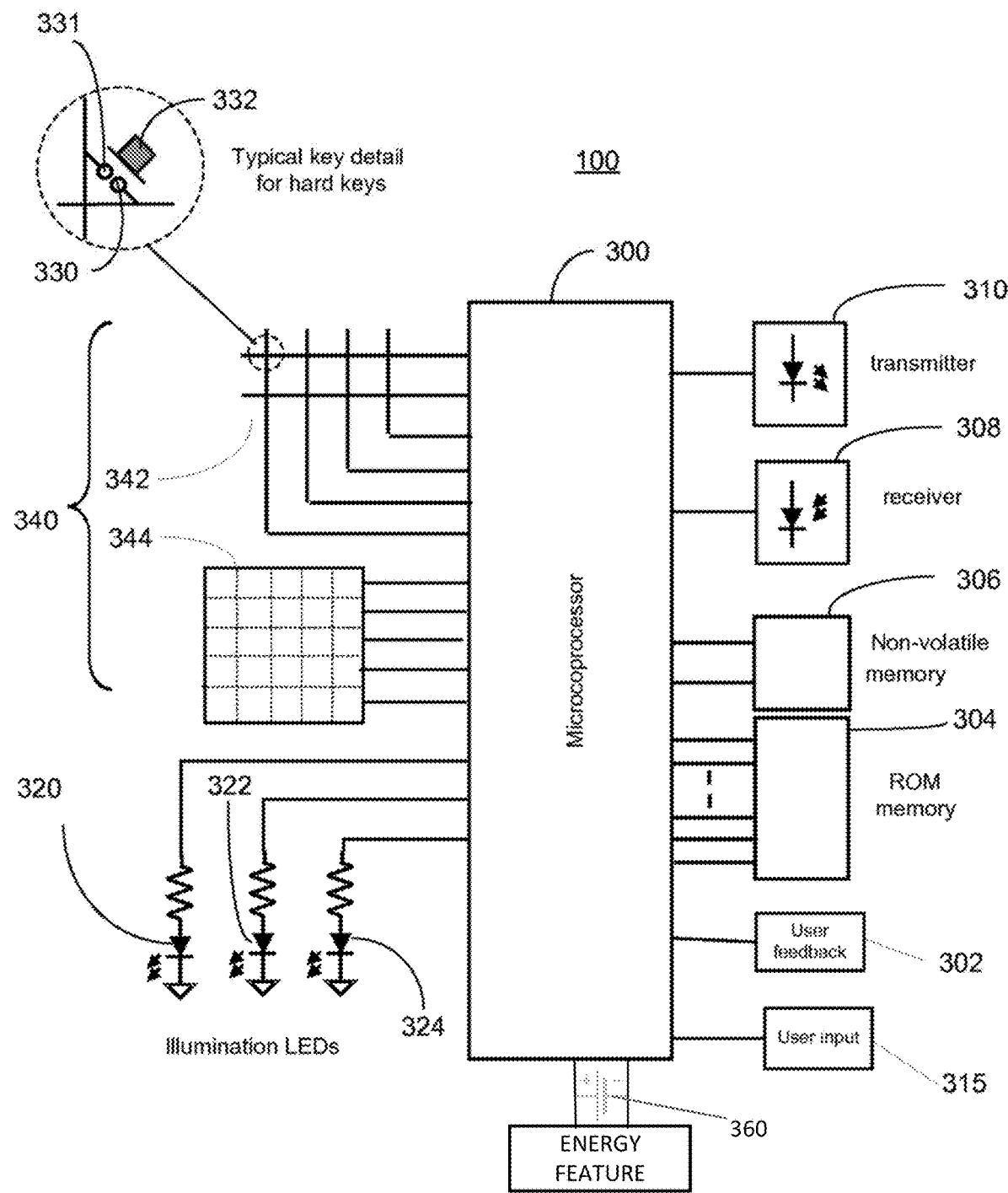
FIG. 2 illustrates a block diagram of example components of the example controlling devices.

For use in commanding the functional operations of one or more appliances, the controlling devices 100 may include, as needed for a particular application, a processor 300 coupled to a ROM memory 304, a key matrix 340 (e.g., soft keys 344 such as a touch sensitive surface placed over an underlying surface on which key icons are printed or etched alone or combined with hard keys 342, a touch sensitive surface placed over a liquid crystal display (LCD) or an electroluminescent display (EL), etc.), transmission circuit(s) 310, receiver circuit(s) 308 and/or transceiver circuit(s) (e.g., IR and/or RF), a non-volatile read/write memory 306, a means 302 to provide feedback to the user (e.g., LED, display, speaker, and/or the like), a means 315 (such as a microphone, etc.) for receiving additional non-keypress input from the user, and means for providing visual and/or audio cues to the user, as illustrated in FIG. 2. The various devices may be powered by a battery power source 360, e.g., two AA batteries, as is conventional. As described further below, the battery power source 360 can alternatively or additionally include a power store, such as a capacitor, that is provided with/charged using harvested energy.

The means for providing visual and/or audio cues to the user so as to disseminate information to the user may be embodied as key illumination means, a device face illumination means, a sound or voice synthesizer circuit and/or a digital recording and playback circuit (for example to allow a user to playback sound or voice tags input via a microphone or otherwise downloaded into the controlling device). The key illumination means may be in the form of separate elements, such as LEDs 320, 322, and 324, either directly associated with a hard key matrix or used for indirect general illumination of an area such as in the case of an internally illuminated translucent display panel, i.e., a face panel that allows all or some incident light to pass completely through it, or may be integrated as part of the key matrix, for example in the case where the key matrix is implemented using a touch screen display overlaid on an LCD, EL or ink screen printed display panel. In the case where the controlling device 100 includes hard keys, an exemplary molded-in key 332 is shown as operative with key matrix circuit 330, 331.

As will be understood by those skilled in the art, the ROM memory 304 may include executable instructions that are intended to be executed by the processor 300 to control the operation of the remote control 100. In this manner, the processor 300 may be programmed to control the various electronic components within the remote control 100, e.g., to monitor/control the power supply 360, to cause the transmission of signals, control the key illumination means 320, 322, and 324, sound circuits, device face illumination means, etc. The non-volatile read/write memory 306, for example an EEPROM, battery-backed up RAM, Smart Card, memory stick, or the like, may be provided to store setup data and parameters as necessary. While the memory 304 is illustrated and described as a ROM memory, memory 304 can also be comprised of any type of readable media, such as ROM, RAM, SRAM, FLASH, EEPROM, or the like. Preferably, the memory 304 is non-volatile or battery-backed such that data is not required to be reloaded after battery changes. In addition, the memories 304 and 306 may take the form of a chip, a hard disk, a magnetic disk, and/or an optical disk.

To cause the controlling device 100 to perform an action, the controlling device 100 is adapted to be responsive to events, such as a sensed user interaction with the key matrix 340, receipt of a transmission via receiver 308, etc. In response to an event, appropriate instructions within the memory 304 may be executed. For example, when a function command key is activated on the controlling device 100, the controlling device 100 may retrieve a command code corresponding to the activated function command key from memory 304 and transmit the command code to an intended target appliance, e.g., STB 104, in a format recognizable by that appliance. It will be appreciated that the instructions within the memory 304 can be used not only to cause the transmission of command codes and/or data to the appliances, but also to perform local operations. While not limiting, local operations that may be performed by the controlling device 100 may include displaying information/data, favorite channel setup, macro key setup, function key relocation, user programming of favorite channel selections, etc. A further, local operation is the ability to "lock" function keys across device operational modes as described in U.S. Published Patent Application No. 2003/0025840. Examples of still further local operations can be found in U.S. Pat. Nos. 5,481,256, 5,959,751, and 6,014,092.

For creating a correspondence between a command code and a function command key, data may be entered into the controlling device 100 that functions to identify an intended target appliance by its type and make (and sometimes model). Such data allows the controlling device 100 to transmit recognizable command codes in the format appropriate for such identified appliances. Typically, intended target appliances are identified for each operational mode of the controlling device 100. Since methods for setting up a controlling device to command the operation of specific home appliances are well-known, such methods need not be described in greater detail herein. Nevertheless, for additional information pertaining to setup procedures, the reader may turn to U.S. Pat. Nos. 4,959,810, 5,614,906, and 6,225,938. It will also be appreciated that a controlling device 100 may be set up to command an appliance 102 by being taught the command codes needed to command such appliance as described in U.S. Pat. No. 4,623,887. Still further, it will be understood that command codes may be pre-stored in the controlling device 100 or the controlling device 100 may be upgradeable, for example via use of receiver 308.

Figures 3A, 3B:
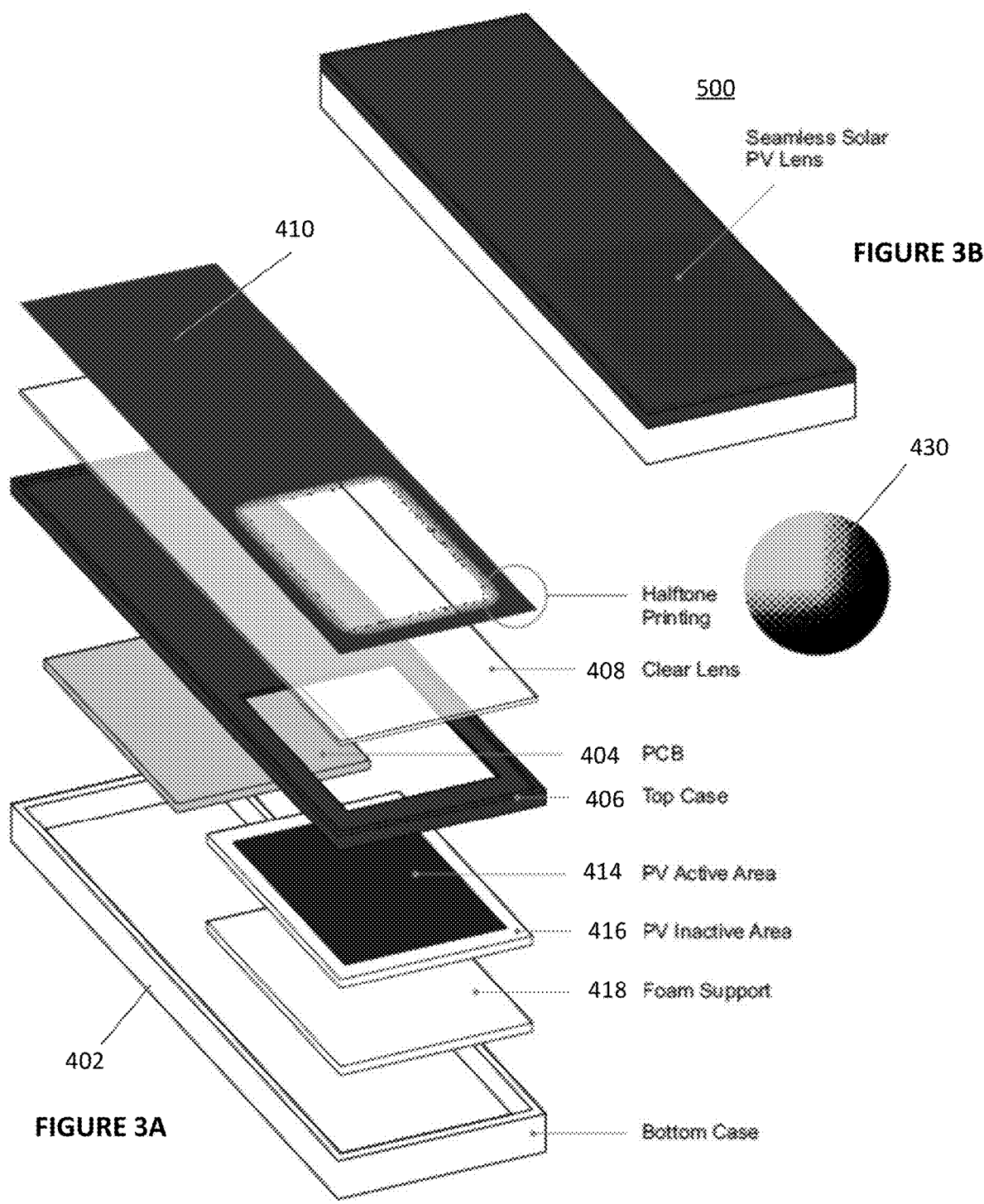
FIG. 3A illustrates an exploded view of an example controlling device, light-based energy harvesting feature.
FIG. 3B illustrates the assemblage of the controlling device, light-based energy harvesting feature of FIG. 3A.
Figure 4:
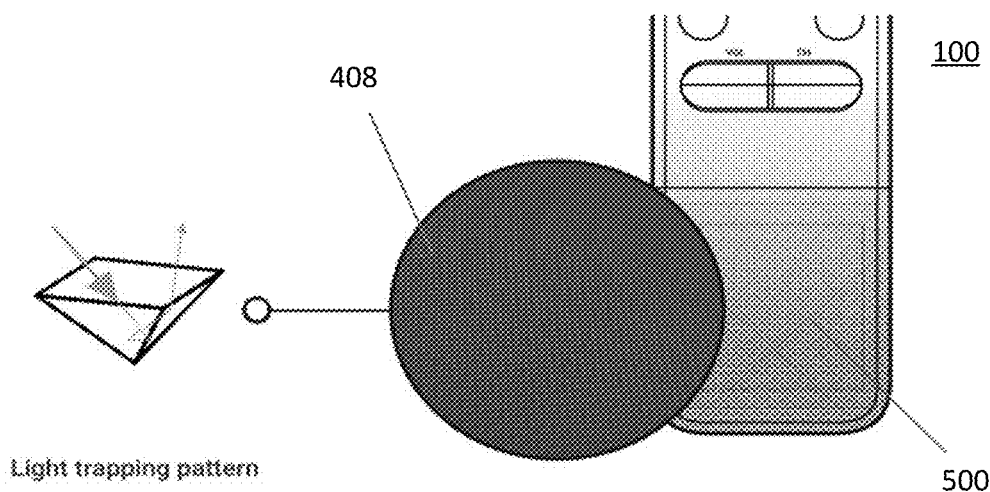
FIG. 4 illustrates a portion of a lens usable with the light-based energy harvesting feature of FIG. 3A.

Turning to FIGS. 3A and 3B, an example light-based energy harvesting feature 500 which is intended to be seamlessly incorporated into the controlling device 100 is shown. In the example, at least the electronic components necessary to collect, store, and use the light energy are preferably included on printed circuit board (PCB) 404 and the PCB 404 is preferably maintained within a housing which, in this example, comprises a housing lower section 402 that is adjoined to a housing upper section 406. The lower and/or the upper housing sections could be integral to the casing of the remote control 100 as shown in FIG. 4 or the housing components 402 could be seamlessly attached to the casing of the remote control 100 as desired. In either case, the upper housing portion 406 is intended to support a photovoltaic (PV) lens. The PV lens in this example is comprised of a clear lens 408 that is associated with a mask 410.

As further seen in FIG. 3A, the top casing portion 406 includes an opening 412, e.g., a square or rectangular opening, under which is positioned a PV active area 414 of a PV supporting substrate 416. As will be appreciated, the PV active area 414 is coupled to the energy management components of the PCB 404. While not required, a foam support 418 may be positioned under the PV substrate 416 to support the PV substrate 416 within the housing and to maintain the PV active area 414 of the PV substrate 416 in alignment with the opening 412. While not illustrated in FIG. 3A, it will be appreciated that components of the seamless light or solar lens, when installed within the controlling device 100, will be coupled to the remaining components of the remote control 100, such as the processor, as needed.

With respect to the mask 410, the mask 410 is intended to cooperate with the lens 408 such that the lens 408 and, accordingly, the entirety of the seamless solar assemblage, will blend into the controlling device casing. In other words, the mask 410 is intended to conceal or hide the fact that the controlling device 100 includes a light-based energy harvesting feature while still allowing for light to access the PV active area 414. To this end, the mask 410 may comprise a halftone dotted mask 430 printed on the top surface of the lens 408 so as to visually blur the opening 412 in the top case frame 406. The halftone dotted mask will thus function to make the energy harvesting feature look more seamless while still allowing enough light to pass therethrough to maintain good light performance. The halftone dotted mask can partially overlie the opening 414, such as by being positioned over top of the side edges of the opening 412 as illustrated in FIG. 3A, or can be positioned to completely overlie the opening 412. The portions of the lens 408 not overlying the PV active area 414 can be completely masked so as to completely blend into the overall appearance of the controlling device 100. The mask 410 can be applied using in-mold decoration (IMD).

In further examples, the mask 410 can be printed on a substrate with the substrate being placed upon the lens 408. Similarly, the mask 410 need not be provided by the use of printed ink but can be provided by use of other surface finishes such a one-way mirror, tint, etc. Accordingly, the concept is not to be limited to "printing" but can be more generally considered as being a "finishing" the is provided directly or indirectly to the surface of the lens 408 for the purpose of blending the PV area into the overall controlling device design.

As noted above, the PV assembly is desired to provide a light panel lens with special patterns and textures to maximize PV cell performance while visually disguised the PV panel under the lens. As further shown in FIG. 4, the surface patterns and textures provided to the lens 408 are preferably selected to increase refractive light while reducing reflection, therefore maximizing energy generation. To this end, one or more of the following surface patterns may be utilized: reverse pyramids varying in size, depth, and pattern (as shown in FIG. 4); reverse cones varying in size, depth, and pattern; frosted surfaces; and tinted surfaces in different colors allowing different spectrums of light through. Such a light panel will be understood to have a higher energy density that can effectively generate power under normal indoor lighting conditions.

In addition to the use of a light-based energy harvesting feature, it is also contemplated that the controlling device 100 can use the additional or alternative energy harvesting features. For example, one or more of the hard keys 332, if utilized, may be associated with a piezoelectric capture module and a power supply management module (which module may be included as a component part of the processing device 300). In this manner, when the hard key 332 is activated by a user, the piezoelectric capture module will function to convert the mechanical energy associated with the pressing movement of the key 332 into electrical energy and the resulting electrical energy will be managed, e.g., stored and used, as dictated by the instructions of which the power supply management module is comprised. A non-limiting example of such an energy harvesting key may be found CN112631444A the disclosure of which is incorporated hereby by reference in its entirety. It will also be appreciated that a piezoelectric device can be utilized to harvest energy in response to general movements of the controlling device 100 itself. Still further, it will be appreciated that RF harvesting can be used to generate power from ambient RF signals as a supplemental energy source.

While various concepts have been described in detail, it will be appreciated by those skilled in the art that various modifications and alternatives to those concepts could be developed in light of the overall teachings of the disclosure. Additionally, while the embodiments presented above are described in the context of universal remote controls (i.e. controlling devices capable of commanding the operation of multiple classes of appliances devices from multiple manufacturers) as being most broadly representative of controlling devices in general, it will be appreciated that the teachings of this disclosure may be equally well applied to other controlling devices of narrower capability without departing from the spirit and scope of the present invention. As such, the particular concepts disclosed are meant to be illustrative only and not limiting as to the scope of the invention which is to be given the full breadth of the appended claims and any equivalents thereof.

All documents cited within this application for patent are hereby incorporated by reference in their entirety.

What is claimed is:

1. A controlling device, comprising:
   a housing;
   a processing device;
   a user input coupled to the processing device;
   a transmitter coupled to the processing device wherein the processing device causes the transmitter to send commands responsive to select user interactions with the user input;
   a power store for providing power to the transmitter and the processing device; and
   at least a light-based energy harvesting system disposed within the housing and coupled to the power store;
   wherein the light-based energy harvesting system comprises a substrate having a photovoltaic (PV) active area and a lens, separate from the substrate, comprising a plurality of reverse pyramids disposed over the PV active area.

2. The controlling device as recited in claim 1, wherein the user input comprises a depressible, physical key and the controlling device further comprises a piezoelectric capture module associated with the depressible, physical key and coupled to the power store.

3. The controlling device as recited in claim 1, further comprising a radio frequency harvesting module coupled to the power store.

4. A controlling device, comprising:
   a housing;
   a processing device;
   a user input coupled to the processing device;
   a transmitter coupled to the processing device wherein the processing device causes the transmitter to send commands responsive to select user interactions with the user input;
   a power store for providing power to the transmitter and the processing device; and
   at least a light-based energy harvesting system disposed within the housing and coupled to the power store;
   wherein the light-based energy harvesting system comprises a substrate having a photovoltaic (PV) active area and a lens, separate from the substrate, comprising a plurality of reverse cones disposed over the PV active area.

5. The controlling device as recited in claim 4, wherein the user input comprises a depressible, physical key and the controlling device further comprises a piezoelectric capture module associated with the depressible, physical key and coupled to the power store.

6. The controlling device as recited in claim 4, further comprising a radio frequency harvesting module coupled to the power store.

* * * * *